(12) United States Patent
Makihara et al.

(10) Patent No.: US 7,768,032 B2
(45) Date of Patent: Aug. 3, 2010

(54) LIGHT-EMITTING DEVICE WITH ENHANCED LUMINOUS EFFICIENCY AND METHOD OF PRODUCING THE SAME

(75) Inventors: Katsunori Makihara, Hiroshima (JP); Seiichi Miyazaki, Hiroshima (JP); Seiichiro Higashi, Hiroshima (JP)

(73) Assignee: Hiroshima University, Higashihiroshima-shi, Hiroshima (JP)

( * ) Notice: Subject to any disclaimer, the term of this patent is extended or adjusted under 35 U.S.C. 154(b) by 111 days.

(21) Appl. No.: 12/212,406

(22) Filed: Sep. 17, 2008

(65) Prior Publication Data

US 2009/0236584 A1 Sep. 24, 2009

(30) Foreign Application Priority Data

Mar. 19, 2008 (JP) ............................. 2008-070602

(51) Int. Cl.
*H01L 33/00* (2010.01)
*H01L 21/00* (2006.01)

(52) U.S. Cl. ............................ 257/103; 257/79; 257/88; 257/92; 257/101; 257/102; 257/451; 257/E25.032; 257/E27.113; 257/E33.054; 257/E33.061; 438/22; 438/24; 438/46; 438/47; 438/48

(58) Field of Classification Search .................. 257/79, 257/88, 92, 101, 102, 103, 451, E25.032, 257/E27.113, E33.054, E33.061; 438/22, 438/24, 46, 47, 48
See application file for complete search history.

(56) References Cited

U.S. PATENT DOCUMENTS

| 7,239,081 B2 * | 7/2007 | Tsutsui ........................ 313/503 |
| 2008/0157102 A1 * | 7/2008 | Hori et al. ....................... 257/88 |
| 2008/0237628 A1 * | 10/2008 | Satoh et al. ................... 257/103 |
| 2009/0206323 A1 * | 8/2009 | Yokoyama ..................... 257/13 |

FOREIGN PATENT DOCUMENTS

| JP | 09-102596 | 4/1997 |
| JP | 11-354839 | 12/1999 |
| JP | 2003-332695 | 11/2003 |
| JP | 2006-155838 | 6/2006 |

\* cited by examiner

*Primary Examiner*—Dao H Nguyen
(74) *Attorney, Agent, or Firm*—Foley & Lardner LLP

(57) ABSTRACT

A light-emitting device comprises first and second dot members. The first dot member is formed so that it makes contact with the second dot member. The first dot member comprises a plurality of first quantum dot layers. Each of the plurality of first quantum dot layers comprises a plurality of first quantum dots and a silicon dioxide film. The first quantum dot comprises an n-type silicon dot. The second dot member comprises a plurality of second quantum dot layers. Each of the plurality of second quantum dot layers comprises a plurality of second quantum dots and a silicon dioxide film. The second quantum dot comprises a p-type silicon dot.

11 Claims, 19 Drawing Sheets

(j)

(k)

LIGHT-EMITTING DEVICE WITH ENHANCED LUMINOUS EFFICIENCY AND METHOD OF PRODUCING THE SAME

CROSS-REFERENCE TO RELATED APPLICATIONS

This application claims the benefit of Japanese Patent Application No. 2008-070602 filed on Mar. 19, 2008, the entire disclosure of which is incorporated by reference.

BACKGROUND

The present disclosure relates to light-emitting devices and methods of producing the same. The present disclosure particularly relates to light-emitting devices using quantum dots and methods of producing the same.

One well-known semiconductor light-emitting device having a semiconductor island structure (quantum dots) (Japanese Unexamined Patent Application Publication No. 2003-332695) is a semiconductor light-emitting device comprising an n-type AlGaAs, an n-type GaAs, an InGaAs island structure, a compound semiconductor containing nitrogen, a p-type GaAs, and a p-type AlGaAs.

The internal stress of the InGaAs island structure includes compressive stress, whereas the compound semiconductor containing nitrogen has tensile stress. The compound semiconductor containing nitrogen is disposed so as to be in contact with the InGaAs island structure. As a result, the internal stress in the InGaAs island structure is reduced by the tensile stress in the compound semiconductor containing nitrogen.

As a result, the internal stress in the InGaAs island structure, which is a luminous layer, is reduced, resulting in a luminescence spectrum of 1.55 µm at room temperature.

BRIEF SUMMARY

Unfortunately, in conventional semiconductor light-emitting devices, quantum dots constituting a luminous layer are not doped to p-type or n-type. Therefore, both the carrier (electrons and holes) injection into the luminous layer and the luminous efficiency are low.

In order to solve the aforementioned problems, a representative embodiment provides a light-emitting device that allows for enhanced luminous efficiency.

A representative embodiment also provides a method of making a light-emitting device with enhanced luminous efficiency.

In a representative embodiment, a light-emitting device comprises first and second dot members. The first dot member includes a first quantum dot having a first conductive type. The second dot member is disposed so as to be in contact with the first dot member and includes a second quantum dot having a second conductive type that is different from the first conductive type.

Preferably, the first dot member includes the first quantum dot and a first insulating layer that covers the first quantum dot. The second dot member includes the second quantum dot and a second insulating layer that covers the second quantum dot.

The light-emitting device preferably further comprises a substrate that is in contact with the first dot member and has the first conductive type. The second dot member is disposed on the first dot member.

Preferably, the first conductive type is p-type, and the second conductive type is n-type.

Preferably, the first conductive type is n-type, and the second conductive type is p-type.

Each of the first and second quantum dots is preferably formed of a silicon dot Preferably, each of the first and second quantum dots is formed of a metal silicide dot.

Also provided is a method of producing a light-emitting device that comprises a first step of depositing a first dot member, which includes a first quantum dot having a first conductive type, on a main surface of a semiconductor substrate having the first conductive type; and a second step of depositing on the first dot member a second dot member that includes a second quantum dot having a second conductive type that is different from the first conductive type.

The first step preferably includes a first sub-step of supplying to the reaction chamber a first material gas for depositing an intrinsic third quantum dot, and a second sub-step of supplying a first impurity gas to the reaction chamber in addition to the first material gas. The second step includes a third sub-step of supplying to the reaction chamber a second material gas for depositing an intrinsic fourth quantum dot, and a fourth sub-step of supplying to the reaction chamber a second impurity gas in addition to the second material gas.

Preferably, in the first sub-step, the first material gas is supplied to the reaction chamber from the first timing to the second timing. In the second sub-step, in addition to the first material gas, the first impurity gas is supplied to the reaction chamber from a third timing to the second timing; and the third timing is set to be between the first timing and the second timing. In the third sub-step, the second material gas is supplied to the reaction chamber from a fourth timing to a fifth timing. In the fourth sub-step, in addition to the second material gas, the second impurity gas is supplied to the reaction chamber from a sixth timing to the fourth timing; and the sixth timing is set to be between the fourth timing and the fifth timing.

Preferably, the third timing is after the intermediate time between the first timing and the second timing, and the sixth timing is after the intermediate time between the fourth timing and the fifth timing.

The first material gas is preferably the same as the second material gas.

Preferably, in the first sub-step, a silane gas is supplied to the reaction chamber; in the second sub-step, a phosphine gas is supplied to the reaction chamber in addition to the silane gas; in the third sub-step, a silane gas is supplied to the reaction chamber; and in the fourth sub-step, a diborane gas is supplied to the reaction chamber in addition to the silane gas.

Preferably, in the first sub-step, a silane gas is supplied to the reaction chamber; in the second sub-step, a diborane gas is supplied to the reaction chamber in addition to the silane gas; in the third sub-step, a silane gas is supplied to the reaction chamber; and in the fourth sub-step, a phosphine gas is supplied to the reaction chamber in addition to the silane gas.

The length of time between the first timing and the second timing is preferably substantially equal to the length of time between the fourth and fifth timings.

In the light-emitting device, either an electron or a hole is supplied to the first dot member via a quantum dot that is included in either the first or second dot member, and is confined in the quantum dot. Likewise, the other of the electron or the hole is supplied to the second dot member via a quantum dot that is included in the other of the first or the second dot member, and is confined in the quantum dot. The electron and the hole, respectively, which confined in the quantum dots, are then held in the quantum dots until the electron and the hole recombine to emit light. This results in enhanced luminous efficiency.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
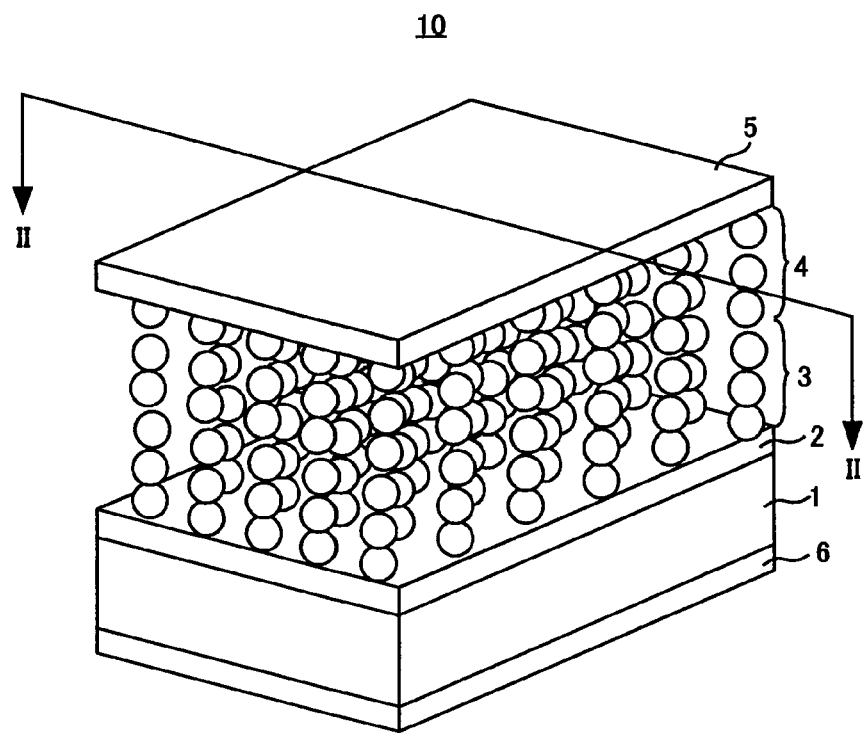
FIG. 1 is a perspective view of a light-emitting device in accordance with an illustrative embodiment of the present invention.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here.

The following is a detailed description of representative embodiments with reference to the drawings. In the figures, identical or like components are identically denoted by the same reference numbers, and explanations thereof are not repeated.

Figure 2:
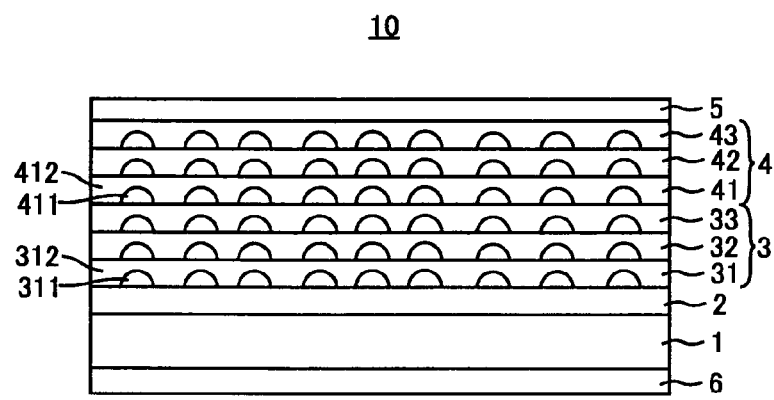
FIG. 2 is a cross-sectional view of the light-emitting device taken along Line II-II of FIG. 1.

FIG. 1 is a perspective view of a light-emitting device in accordance with a representative embodiment. FIG. 2 is a cross-sectional view of the light-emitting device taken along Line II-II of FIG. 1. With reference to FIGS. 1 and 2, a light-emitting device 10 in accordance with a representative embodiment comprises a substrate 1, a silicon dioxide film 2, dot members 3 and 4, and electrodes 5 and 6.

The substrate 1 has a surface (100) and contains $n^+$-type silicon ($n^+$-Si) having a resistivity of approximately 0.1 Ω·cm. The silicon dioxide film 2 is formed on a main surface of the substrate 1. The silicon dioxide film 2 has a thickness of approximately 3.5 nm.

The dot member 3 is formed on the silicon dioxide film 2 so that it makes contact with the silicon dioxide film 2. The dot member 4 is formed on the dot member 3 so that it makes contact with the dot member 3. The electrode 5 is formed on the dot member 4 so that it makes contact with the dot member 4. The electrode 5 contains gold (Au), for example. The electrode 6 contains aluminum (Al), for example, and is formed on the back surface of the substrate 1.

The dot member 3 comprises quantum dot layers 31 to 33. The quantum dot layer 31 comprises a plurality of quantum dots 311 and a silicon dioxide film 312 covering the plurality of quantum dots 311. Each of the plurality of quantum dots 311 comprises an n-type silicon dot. The quantum dot 311 has a diameter of some 10 nm or less and a height of some 5 nm. The phosphorus (P) concentration in the quantum dot 311 is $10^{17}$ to $10^{18}$ cm$^{-3}$. The silicon dioxide film 312 has a thickness of 2 nm.

It should be noted that each of the quantum dot layers 32 and 33 has the same structure as the quantum dot layer 31.

The dot member 4 comprises quantum dot layers 41 to 43. The quantum dot layer 41 comprises a plurality of quantum dots 411 and a silicon dioxide film 412 covering the plurality of quantum dots 411. Each of the plurality of quantum dots 411 comprises a p-type silicon dot. The quantum dot 411 has a diameter of some 10 nm or less and a height of some 5 nm. The boron (B) concentration in the quantum dot 411 is $10^{17}$ to $10^{18}$ cm$^{-3}$. The silicon dioxide film 412 has a thickness of 2 nm.

It should be noted that each of the quantum dot layers 42 and 43 has the same structure as the quantum dot layer 41.

The quantum dot layer 31 is formed on the silicon dioxide film 2 so that it makes contact with the silicon dioxide film 2. The quantum dot layer 32 is formed on the quantum dot layer 31 so that it makes contact with the quantum dot layer 31. The quantum dot layer 33 is formed on the quantum dot layer 32 so that it makes contact with the quantum dot layer 32.

As described above, the dot member 3 is a three-fold stack of the quantum dots 31 to 33 comprising the plurality of quantum dots 311, which are composed of n-type silicon dots.

The quantum dot layer 41 is formed on the quantum dot layer 33 so that it makes contact with the quantum dot layer 33. The quantum dot layer 42 is formed on the quantum dot layer 41 so that it makes contact with the quantum dot layer 41. The quantum dot layer 43 is formed on the quantum dot layer 42 so that it makes contact with the quantum dot layer 42.

As described above, the dot member 4 is a three-fold stack of the quantum dots 41 to 43 comprising the plurality of quantum dots 411 composing of p-type silicon dots.

Figure 3:
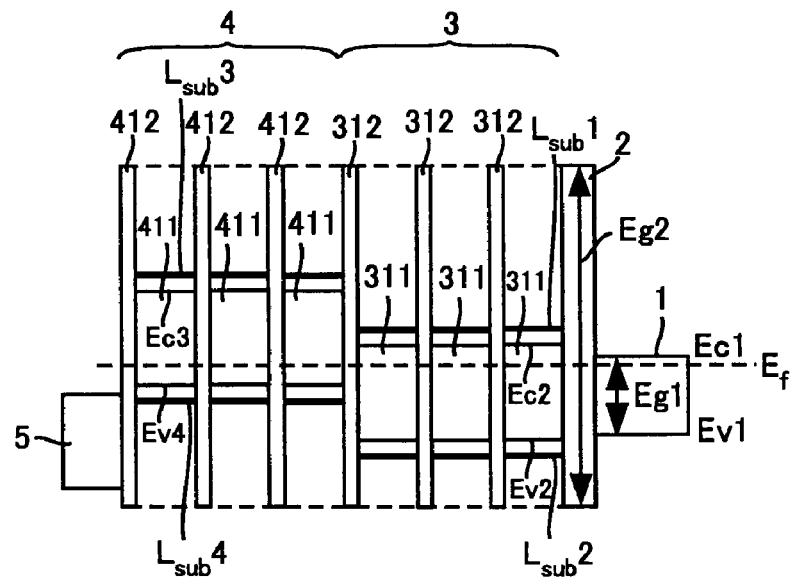
FIG. 3 is an energy band diagram of the light-emitting device shown in FIG. 1 obtained when the device is under zero bias.

FIG. 3 is an energy band diagram of the light-emitting device 10 shown in FIG. 1 under zero-bias. With reference to FIG. 3, the n+Si as the substrate 1 has a conduction band Ec1 and a valence band Ev1, and the n$^+$Si has an energy band gap Eg1 of 1.12 eV.

The silicon dioxide films 2, 312 and 412 have an energy band gap Eg2 of some 9 eV. The quantum dots 311 are held between the two silicon dioxide films 312 and, therefore, because of the quantum size effect, has a sublevel $L_{sub}1$ on the conduction band Ec1 side of the n$^+$Si and a sublevel $L_{sub}2$ on the valence band Ev1 side of the n$^+$Si.

The sublevel $L_{sub}1$ has higher energy than that of the edge of the conduction band Ec1 of the n$^+$Si, while the sublevel $L_{sub}2$ has higher energy than that of the edge of the valence band Ev1 of the n$^+$Si. Accordingly, the energy gap between the sublevel $L_{sub}1$ and the sublevel $L_{sub}2$ is larger than the energy gap Eg1 of the n$^+$Si.

The quantum dots 411 are held between the two silicon dioxide films 412 and, therefore, because of the quantum size effect, have a sublevel $L_{sub}3$ on the conduction band Ec1 side of the n$^+$Si and a sublevel $L_{sub}4$ on the valence band Ev1 side of the n$^+$Si.

The quantum dots 411 are formed of p-type silicon dots, while the quantum dots 311 are formed of n-type silicon dots. Therefore, sublevel $L_{sub}3$ has higher energy than sublevel $L_{sub}1$, and sublevel $L_{sub}2$ has higher energy than sublevel $L_{sub}4$.

Figure 4:
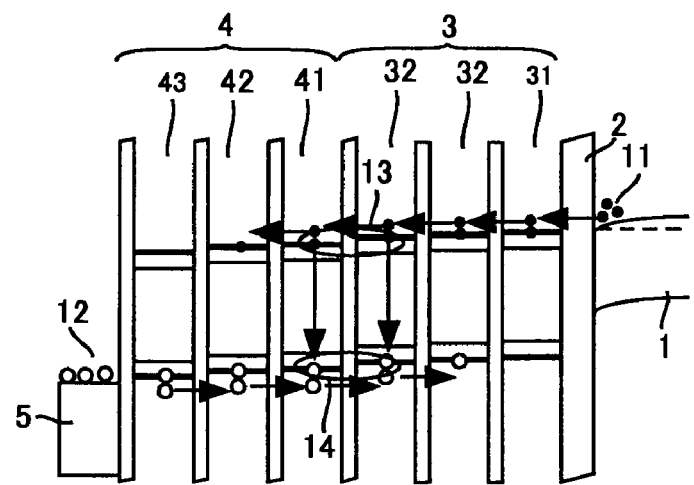
FIG. 4 is an energy band diagram of the light-emitting device shown in FIG. 1 obtained when the device is energized.

FIG. 4 is an energy band diagram of the light-emitting device 10 shown in FIG. 1 obtained when the device is energized. When a voltage is applied between the electrodes 5 and 6, which respectively work as the plus and minus, as is shown in FIG. 4, the energy band of the n$^+$Si as the substrate 1 shifts upward is as follows: electrons 11 in the n$^+$Si conduct pass through the quantum dot layers 31 and 32 via the plurality of quantum dots 311 and are injected into the quantum dot layers 33, 41 and 42. The injected electrons are held by the quantum dots 311 and 411 in the quantum dot layers 33, 41 and 42.

On the other hand, holes 12 in the electrode 5 conduct electrical current through the quantum dot layers 43 and 42 via the plurality of quantum dots 411, which is injected into the quantum dot layers 41, 33 and 32. The injected holes are held by the quantum dots 411 and 311 in the quantum dot layers 41, 33 and 32.

Electrons 13 are then accumulated in the quantum dots 311 and 411 of the quantum dot layers 41 and 33, and recombine with the holes 14 accumulated in the quantum dots 311 and 411 of the quantum dot layers 41 and 33 to emit light.

In the light-emitting device 10, the plurality of quantum dots 311 in the quantum dot layers 31 to 33 are n-doped, while the plurality of the quantum dots 411 in the quantum dot layers 41 to 43 are p-doped. Therefore, the plurality of quantum dots 311 have a sublevel $L_{sub}1$ lower than that obtained when the plurality of quantum dots 311 are not n-doped. The quantum dots 411 have a sublevel $L_{sub}4$ lower than that obtained when the quantum dots 411 are not p-doped. As a result, electrons in the n$^+$Si conduct through the quantum dot layers 31 and 32 more easily than when the plurality of quantum dots 311 are not n-doped, and more electrons are accumulated in the quantum dot layers 33 and 41. Likewise, holes in the electrode 5 conduct through the quantum dot layers 43 and 42 more easily than when the plurality of quantum dots 411 are not p-doped, and more holes are accumulated in the quantum dot layers 41 and 33. As a result, the present invention provides higher luminous efficiency.

Figure 5:
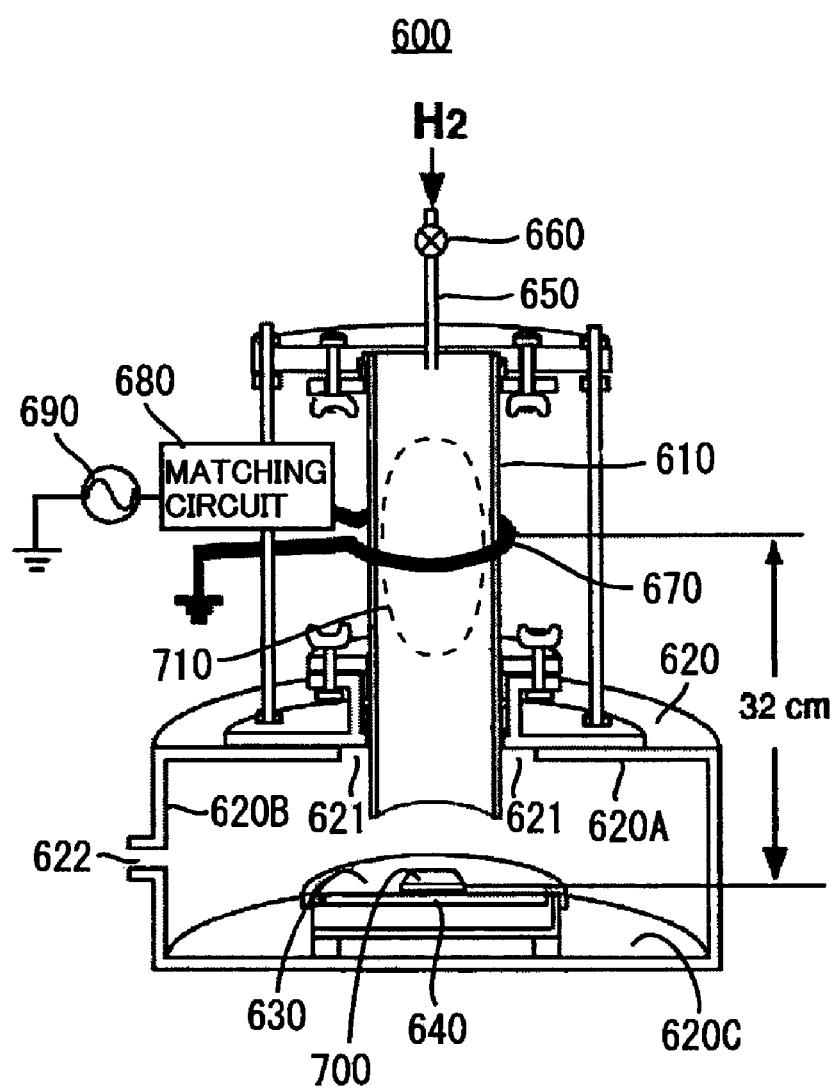
FIG. 5 is a schematic diagram of a plasma processing device for remote hydrogen plasma treatment.

FIG. 5 is a schematic diagram of a plasma processing device for remote hydrogen plasma treatment. With reference to FIG. 5, a plasma processing device 600 comprises a quartz tube 610, a reaction chamber 620, a substrate holder 630, a heater 640, a pipe 650, a valve 660, an antenna 670, a matching circuit 680 and a high-frequency power source 690.

The quartz tube 610 has a diameter of 10 cmϕ and is fixed so that one end thereof is inserted into the reaction chamber 620. The reaction chamber 620 is in the shape of a hollow cylinder and comprises an opening 621 on the upper surface 620A, in which one end of the quartz tube 610 is inserted, and an outlet 622 on the side surface 620B. Inserting one end of the quartz tube 610 into the reaction chamber 620 via the opening 621 allows the internal space of the reaction chamber 620 to communicate with the internal space of the quartz tube 610. Therefore, gases inside the reaction chamber 620 and the quartz tube 610 are exhausted by a pump (not illustrated) via the outlet 622.

The substrate holder 630 is disposed on the inner bottom surface 620C of the reaction chamber 620. The heater 640 is formed of silicon carbide (SiC) and disposed inside the substrate holder 630.

The pipe 650 is connected to the other end of the quartz tube 610 via the valve 660. The valve 660 is mounted on the pipe 650. The antenna 670 is disposed 32 cm away from a substrate 700, which is disposed on the substrate holder 630, and surrounds the quartz tube 610. One end of the antenna 670 is connected to the matching circuit 680, while the other end is grounded.

The matching circuit 680 is disposed between one end of the antenna 670 and the high-frequency power source 690. The high-frequency power source 690 is connected between the matching circuit 680 and the ground node.

The heater 640 heats the substrate 700, through the substrate holder 630, to a certain temperature. The pipe 650 introduces a hydrogen (H2) gas from a cylinder (not illustrated) into the quartz tube 610. The valve 660 supplies the H2 gas to the quartz tube 610 and cuts off the H2 gas supply to the quartz tube 610.

The matching circuit 680 lowers the reflection of high-frequency power, which is supplied from the high-frequency power source 690, to the high-frequency power source 690 side, and supplies high-frequency power to the antenna 670. The high-frequency power source 690 supplies high-frequency power at 60 MHz to the antenna 670 via the matching circuit 680.

In the processing operation in the plasma processing device 600, a substrate 700 is disposed on the substrate holder 630, and the reaction chamber 620 and the quartz tube 610 are evacuated through the outlet 622. The valve 660 is then opened, and a certain amount of H2 gas is introduced from the cylinder (not illustrated) to the quartz tube 610 through the pipe 650. When the pressure inside the quartz tube 610 is increased to a certain level, the high-frequency power source 690 supplies high-frequency power of 60 MHz to the antenna 670 via the matching circuit 680. In this case, the matching circuit 680 is arranged so that the reflection of high-frequency power, which is supplied from the high-frequency power source 690, to the high-frequency power source 690 side is the lowest possible.

A plasma 710 is subsequently generated inside the quartz tube 610, and a substance consisting mostly of atomic hydrogen diffuses through the quartz tube 610 from the generation area of the plasma 710 to the direction of the substrate 700. The atomic hydrogen then reaches the surface of the substrate 700 and processes the surface of the substrate 700.

After the surface of the substrate 700 has processed for a certain time, the final steps of the processing operation are performed, which comprise turning off the high-frequency power source 690 and closing the valve 660.

Figure 6:
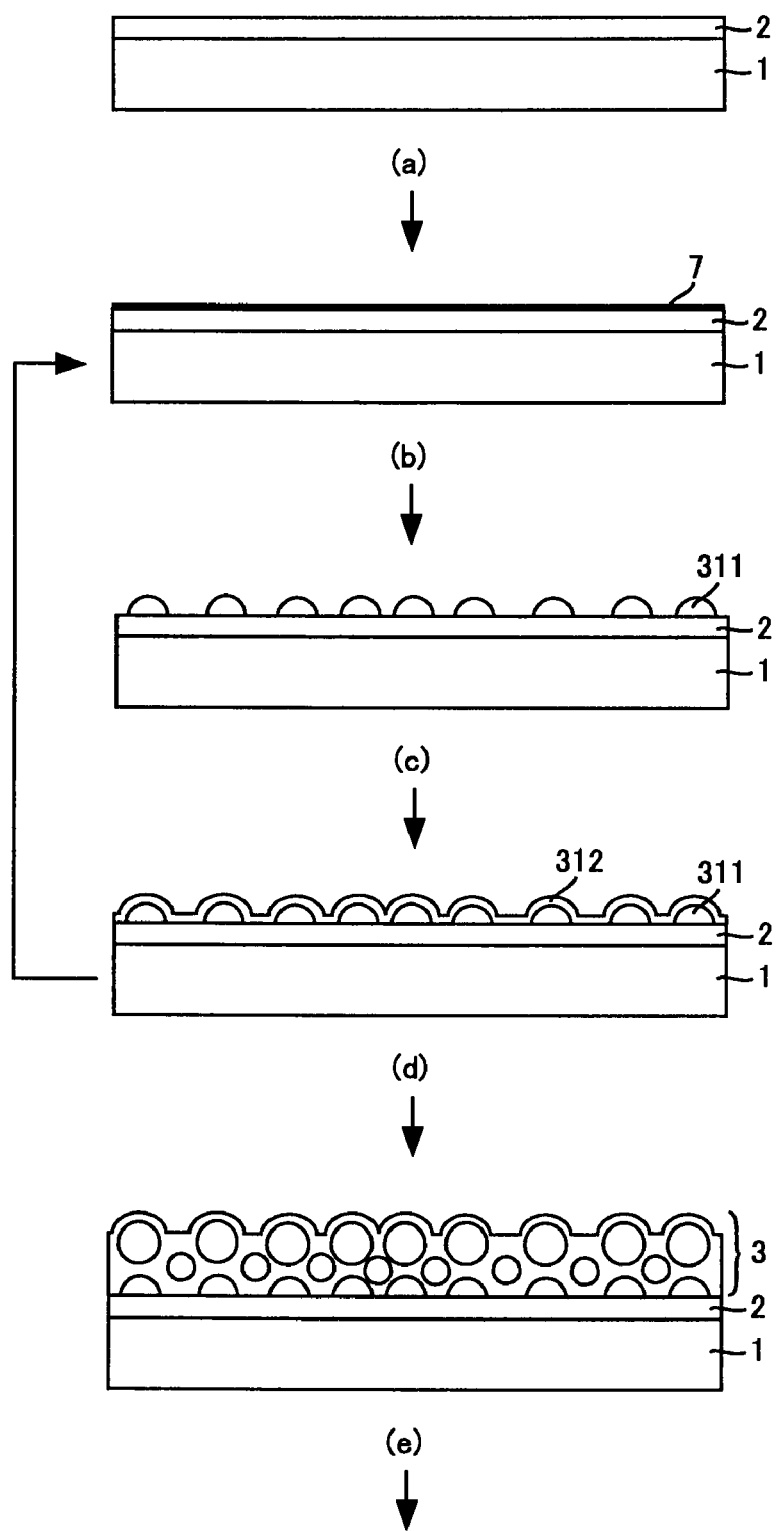
FIG. 6 is a first flowchart illustrating how the light-emitting device shown in FIG. 1 is fabricated.
Figure 7:
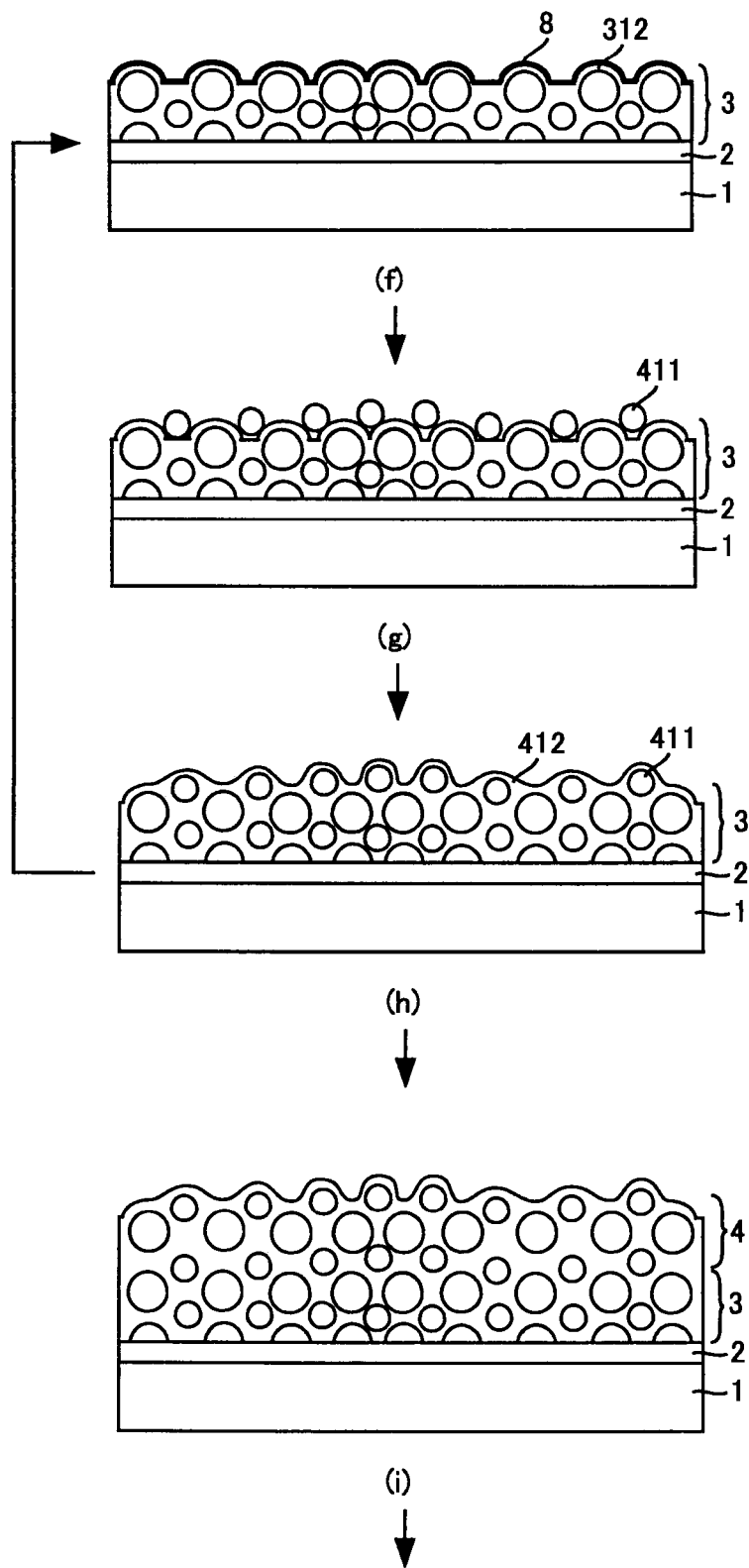
FIG. 7 is a second flowchart illustrating how the light-emitting device shown in FIG. 1 is fabricated.
Figure 8:
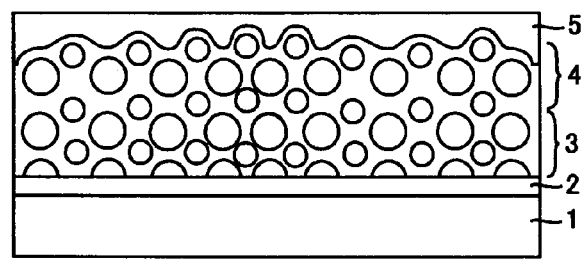
FIG. 8 is a third flowchart illustrating how the light-emitting device shown in FIG. 1 is fabricated.
Figure 8:
Figure 8:
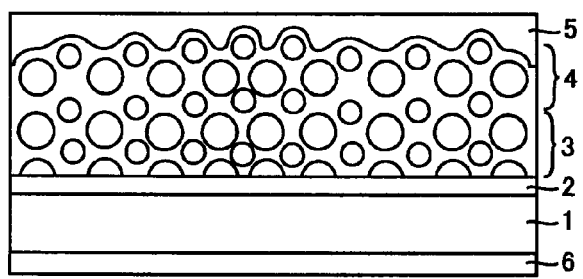

FIGS. 6 to 8 are flowcharts illustrating how the light-emitting device 10 shown in FIG. 1 is fabricated. With reference to FIG. 6, upon starting the fabrication of the light-emitting device 10, the substrate 1, which is formed of n+Si, is prepared. The substrate 1 is cleaned by an RCA cleaning process and then placed in an oxidation device.

A main surface of the substrate 1 is then oxidized in a 2% oxygen atmosphere at approximately 1,000° C. to form a silicon dioxide film 2 which covers the main surface of the substrate 1 (see step (a) of FIG. 6).

Subsequently, the silicon dioxide film 2 and the substrate 1 are disposed on the substrate holder 630 of the plasma processing device 600. An argon (Ar) gas is then introduced via the plasma processing device 600 into the quartz tube 610, and the surface of the silicon dioxide film 2 is treated by remote argon plasma. An $H_2$ gas is then introduced into the quartz tube 610, and the surface of the silicon dioxide film 2 is treated by remote hydrogen plasma. The surface of the silicon dioxide film 2 is thus terminated with OH 7 (see step (b) of FIG. 6). It should be noted that, in this case, the flow rate of the Ar gas is 50 sccm, while that of the $H_2$ gas is 60 sccm.

The quantum dots 311 are then self-formed in the plasma processing device 600 on the silicon dioxide film 2 by the Low Pressure Chemical Vapor Deposition (LPCVD) using a silane ($SiH_4$) gas and a 10% phosphine ($PH_3$/He) gas diluted with helium (see step (c) of FIG. 6).

In this case, the substrate temperature is 560 degrees centigrade. The reaction pressure is 26.7 Pa. The flow rate of the $SiH_4$ gas is 30 sccm. The flow rate of the $PH_3$ gas is 10 sccm. The reaction time is 3 minutes.

An oxygen ($O_2$) gas is then introduced into the quartz tube 610, and the silicon dioxide film 312 is formed by remote oxygen plasma so as to cover the quantum dots 311 (see step (d) of FIG. 6). In this case, the flow rate of the $O_2$ gas is 50 sccm.

Steps (b) to (d) described above are then repeated twice to form the dot member 3 on the silicon dioxide film 2 (see step (e) of FIG. 6).

The Ar gas is then introduced via the plasma processing device 600 into the quartz tube 610, and the surface of the silicon dioxide film 312, which is the topmost layer of the dot member 3, is treated with remote argon plasma. After that, an $H_2$ gas is introduced into the quartz tube 610, and the surface of the silicon dioxide film 312, which is the topmost layer of the dot member 3, is treated by remote hydrogen plasma. In this way, the surface of the silicon dioxide film 312, which is the topmost layer of the dot member 3, is terminated with OH 8 (see step (f) of FIG. 7). In this case, the flow rates of the Ar gas and the $H_2$ gas are as described above.

In the plasma processing device 600, the quantum dots 411 are then self-formed on the silicon dioxide film 312 by the LPCVD using a $SiH_4$ gas and a 10% diborane ($B_2H_6$/He) gas diluted with helium (see step(g) of FIG. 7).

In this case, the substrate temperature is 560 degrees centigrade. The reaction pressure is 26.7 Pa. The flow rate of the $SiH_4$ gas is 30 sccm. The flow rate of the $B_2H_6$ gas is 10 sccm. The reaction time is 3 minutes.

An $O_2$ gas is then introduced into the quartz tube 610, and the silicon dioxide film 412 is formed by remote oxygen plasma so as to cover the quantum dots 411 (see step (h) of FIG. 7). In this case, the flow rate of the $O_2$ gas is as described above.

Steps (f) to (h) described above are then repeated twice to form the dot member 4 on the dot member 3 (see step (i) of FIG. 7).

The stacked dot member 4, dot member 3, silicon dioxide film 2, and substrate 1 are $N_2$-annealed. In this case, the flow rate of the $N_2$ gas is 1 liter/minute, the temperature is 1,000 degrees centigrade, and the time is 30 minutes.

The electrode 5 is then formed on the dot member 4 by evaporation (see step (j) of FIG. 8), while the electrode 6 is formed on the rear surface of the substrate 1 by evaporation (see step (k) of FIG. 8). In this way, the fabrication of the light-emitting device 10 is completed.

Figure 9:
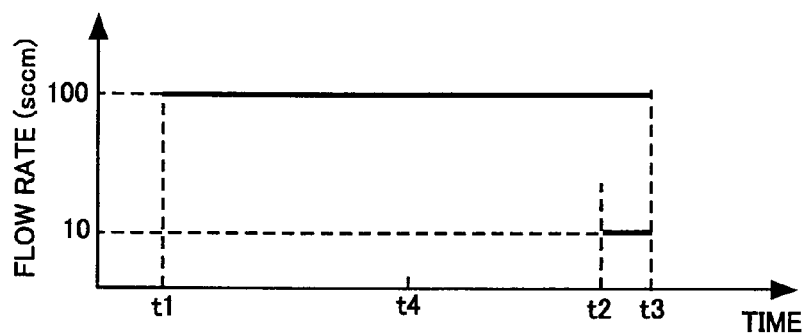
FIG. 9 illustrates the operations in step (c) of FIG. 6 and step (g) of FIG. 7 in detail.

FIG. 9 illustrates the operations in step (c) of FIG. 6 and step (g) of FIG. 7 in detail. With reference to FIG. 9, in step (c) of FIG. 6, the $SiH_4$ gas is supplied to the reaction chamber 620 from timing t1 to timing t3. From timing t2 to timing t3, the $PH_3$ gas is supplied to the reaction chamber 620 in addition to the $SiH_4$ gas, and the quantum dots 311 comprising n-type silicon dots are formed.

Further, in step (g) of FIG. 7, the $SiH_4$ gas is supplied to the reaction chamber 620 from timing t1 to timing t3. From timing t2 to timing t3, the $B_2H_6$ gas is supplied to the reaction chamber 620 in addition to the $SiH_4$ gas, and the quantum dots 411 comprising p-type silicon dots are formed.

The time length between timing t1 and timing t3 is 3 minutes, while the time length between timing t2 and timing t3 is 1 second. As a result, the quantum dots 311 are formed by δ-doping of P, while the quantum dots 411 are formed by δ-doping of B.

As described above, in order to form the quantum dots 311, P is δ-doped by supplying the $PH_3$ gas, which is a source gas for P, to the reaction chamber 620 from timing t2 to timing t3 after timing t4, which is the intermediate time between timing t1 and timing t3 for supplying the $SiH_4$ gas to the reaction chamber 620.

Further, in order to form the quantum dots 411, B is δ-doped by supplying $B_2H_6$ gas, which is a source gas for B, to the reaction chamber 620 from timing t2 to timing t3 after timing t4, which is the intermediate time between timing t1 and timing t3 for supplying the $SiH_4$ gas to the reaction chamber 620.

Further, the amount of time required to supply the $PH_3$ gas to the reaction chamber 620 is the same as the amount of time needed to supply the $B_2H_6$ gas to the reaction chamber 620.

The $PH_3$ gas and $B_2H_6$ gas are supplied to the reaction chamber 620 at the end of the time period between timing t1 and timing t3, during which time the $SiH_4$ gas is supplied, because the quantum dots do not begin to grow immediately after the $SiH_4$ gas begins to be supplied. Therefore, P or B is doped after the quantum dots start growing in order to form the quantum dots 311 and 411, which respectively comprise good-quality n-type silicon dots and p-type silicon dots.

The length of time between timing t2 and timing t3 is an important factor in determining the concentration of P and B in the quantum dots 311 and 411. Therefore, in order to dope P and B to a relatively high concentration, the length of time between timing t2 and timing t3 is set to be relatively long. In order to dope P and B to a relatively low concentration, the length of time between timing t2 and timing t3 is set to be relatively short. In this case, timing t3 may be set to be between timing t1 and timing t4.

The length of time needed to supply the $PH_3$ gas to the reaction chamber 620 may not be the same as that to supply the $B_2H_6$ gas to the reaction chamber 620, and depends on the relationship between the P concentration in the quantum dots 311 and the B concentration in the quantum dots 411. More specifically, if the P concentration in the quantum dots 311 is higher than the B concentration in the quantum dots 411, the length of time needed to supply the $PH_3$ gas to the reaction chamber 620 will be longer than that needed to supply the $B_2H_6$ gas to the reaction chamber 620. If the P concentration in the quantum dots 311 is lower than the B concentration in the quantum dots 411, the length of time needed to supply the $PH_3$ gas to the reaction chamber 620 will be shorter than that to supply the $B_2H_6$ gas to the reaction chamber 620. If the P concentration in the quantum dots 311 is substantially equal to the B concentration in the quantum dots 411, the length of time needed to supply the $PH_3$ gas to the reaction chamber 620 is substantially equal to that needed to supply the $B_2H_6$ gas to the reaction chamber 620.

Figure 10:
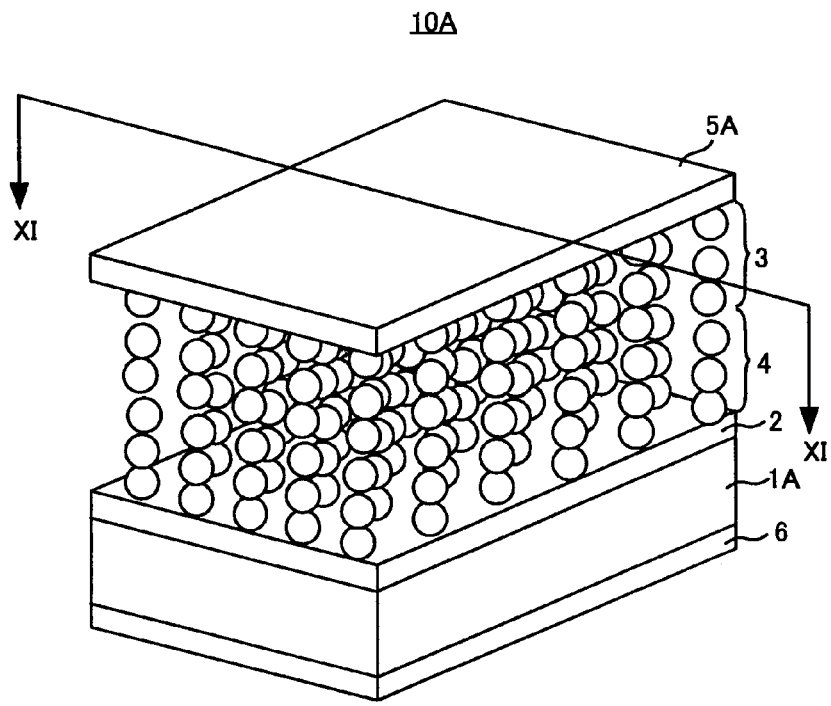
FIG. 10 is a perspective view of another light-emitting device in accordance with an embodiment of the present invention.
Figure 11:
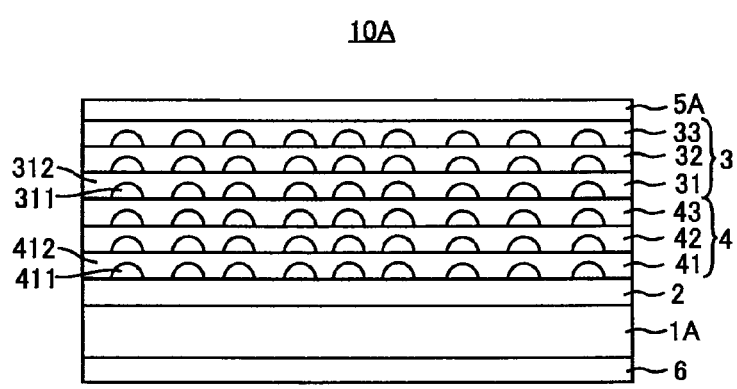
FIG. 11 is a cross-sectional view of the light-emitting device taken along Line XI-XI of FIG. 10.

FIG. 10 is a perspective view of another light-emitting device in accordance with an embodiment of the present invention. FIG. 11 is a cross-sectional view of the light-emitting device taken along Line XI-XI of FIG. 10. With reference to FIGS. 10 and 11, the light-emitting device 10A is identical to the light-emitting device 10 shown in FIGS. 1 and 2, except that the substrate 1 and the electrode 5 of the light-emitting device 10 are respectively replaced with a substrate 1A and an electrode 5A.

It should be noted that in the light-emitting device 10A, the dot member 4 is formed on the silicon dioxide film 2 so that it makes contact with the silicon dioxide film 2. The dot member 3 is formed on the dot member 4 so that it makes contact with the dot member 4.

The substrate 1A is formed of $p^+$-type silicon ($p^+$-Si) having a surface (100) and a resistivity of about 8 to 12 $\Omega \cdot cm$.

The electrode 5A contains Al. The electrode 5A is formed on the dot member 3 so that it makes contact with the dot member 3.

As described above, in the light-emitting device 10A, the dot member 3 and the dot member 4 are laminated on the substrate in the opposite order to that in the light-emitting device 10.

The energy band diagram of the light-emitting device 10A under zero-bias is identical to the energy band diagram shown in FIG. 3, while the energy band diagram of the energized light-emitting device 10A is identical to the energy band diagram shown in FIG. 4. Therefore, the light-emitting device 10A emits light using the same mechanism as that used by the light-emitting device 10.

The light-emitting device 10A is fabricated following the above-described steps (a) through (k) shown in FIGS. 6-8. In order to fabricate the light-emitting device 10A, however, in steps (b) to (d) shown in FIG. 6, a $B_2H_6$ gas is used instead of the $PH_3$ gas, and the quantum dot layers 41 to 43 comprising the quantum dots 411 are sequentially formed on the silicon dioxide film 2. Further, in steps (f) to (h) shown in FIG. 7, a $PH_3$ gas is used instead of the $B_2H_6$ gas, and the quantum dot layers 31 through 33 comprising the quantum dots 311 are sequentially formed on the dot member 4.

Figure 12:
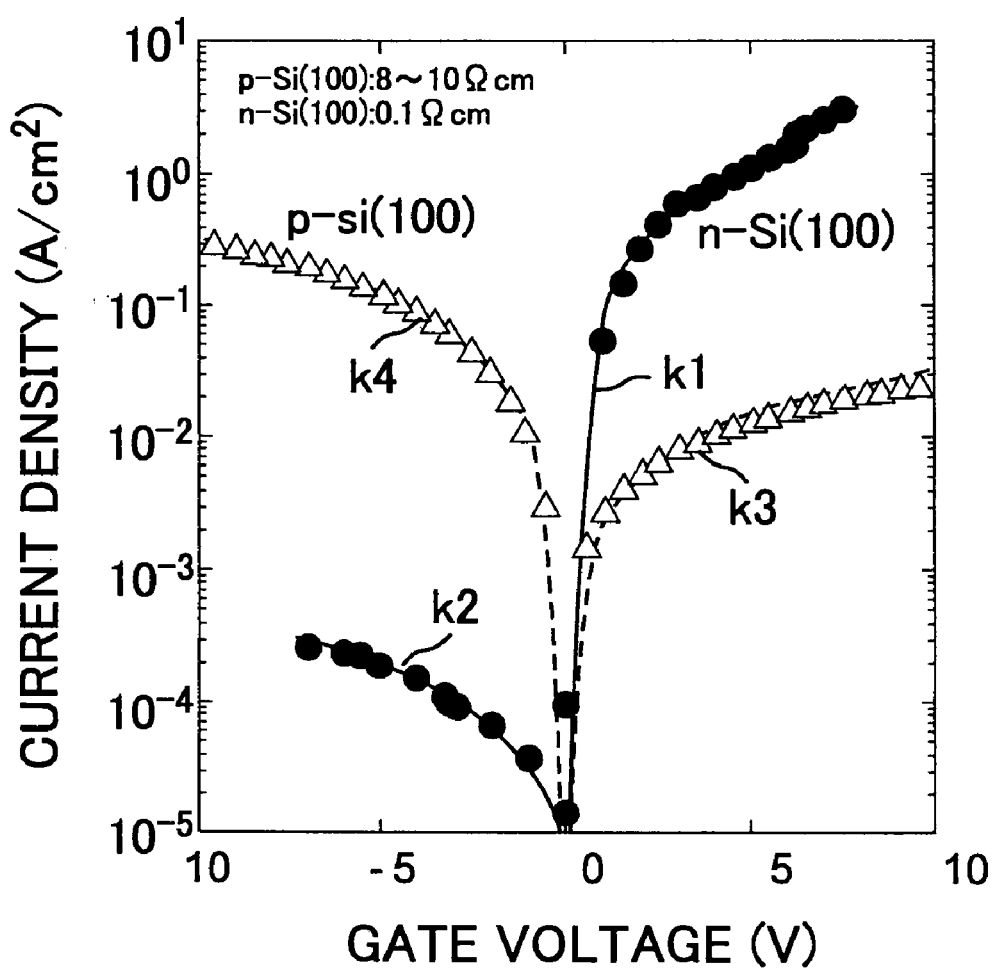
FIG. 12 is a graph illustrating the current-voltage characteristics of the light-emitting devices.

FIG. 12 is a graph illustrating the current-voltage characteristics of the light-emitting devices 10 and 10A. In FIG. 12, the vertical axis represents the current density, while the abscissa axis represents the gate voltage (that is, the voltage between the electrodes 5 and 6 or between the electrodes 5A and 6). Curves k1 and k2 represent the current-voltage characteristics of the light-emitting device 10 shown in FIGS. 1 and 2, while curves k3 and k4 represent the current-voltage characteristics of the light-emitting device 10A shown in FIGS. 10 and 11.

The light-emitting device 10 exhibits a rectification property (see curves k1 and k2), and the light-emitting device 10A also shows a rectification property (see curves k3 and k4).

Therefore, it is understood by those skilled in the art that the light-emitting devices 10 and 10A fabricated by the methods described above have a p-n junction.

Figure 13:
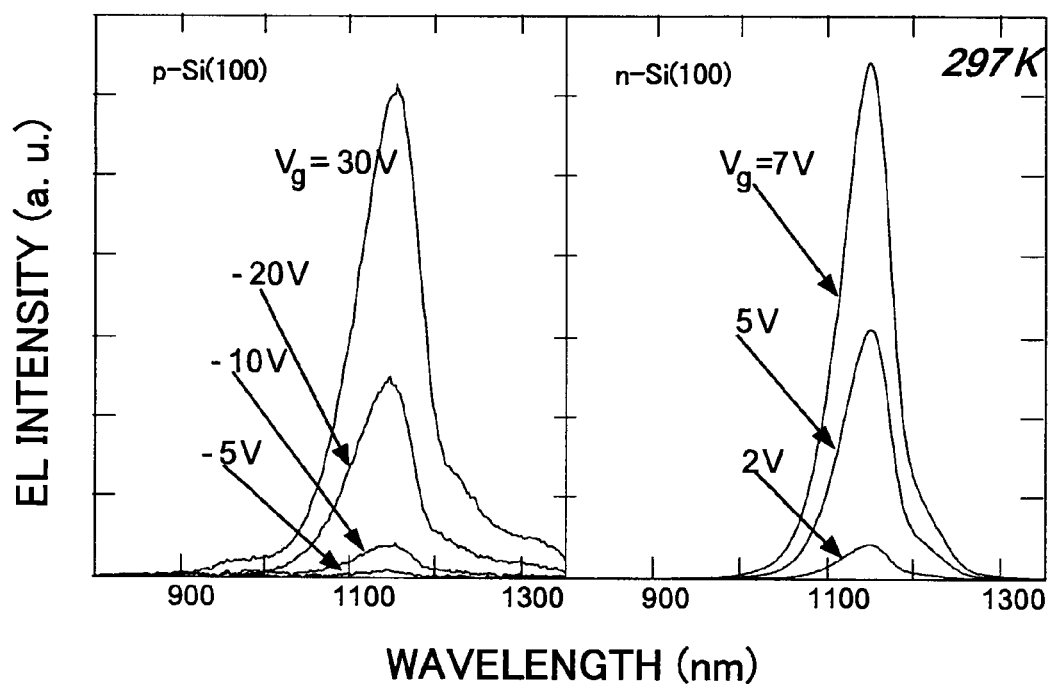
FIG. 13 is a graph illustrating the light-emitting characteristics of the light-emitting devices.

FIG. 13 is a graph illustrating the light-emitting characteristics of the light-emitting devices 10 and 10A. In FIG. 13, the vertical axis represents the EL intensity, while the abscissa axis represents the wavelength.

The right half of FIG. 13 illustrates the light-emitting characteristics of the light-emitting device 10, while the left half of FIG. 13 illustrates the light-emitting characteristics of the light-emitting device 10A.

As is illustrated in FIG. 13, the greater the gate voltage (that is, the voltage between the electrodes 5 and 6 or between the electrodes 5A and 6), the greater the emission intensity. This is because as the gate voltage (that is, the voltage between the electrodes 5 and 6 or between the electrodes 5A and 6) is increased, electrons and holes injected into the dot members 3 and 4 are increased.

As described above, by forming the dot members 3 and 4, which respectively comprise n-type silicon dots and p-type silicon dots, so that the dot members 3 and 4 are in contact with each other, electrons injected into the quantum dots 311 and holes injected into the quantum dots 411 recombine and emit light.

Figure 14:
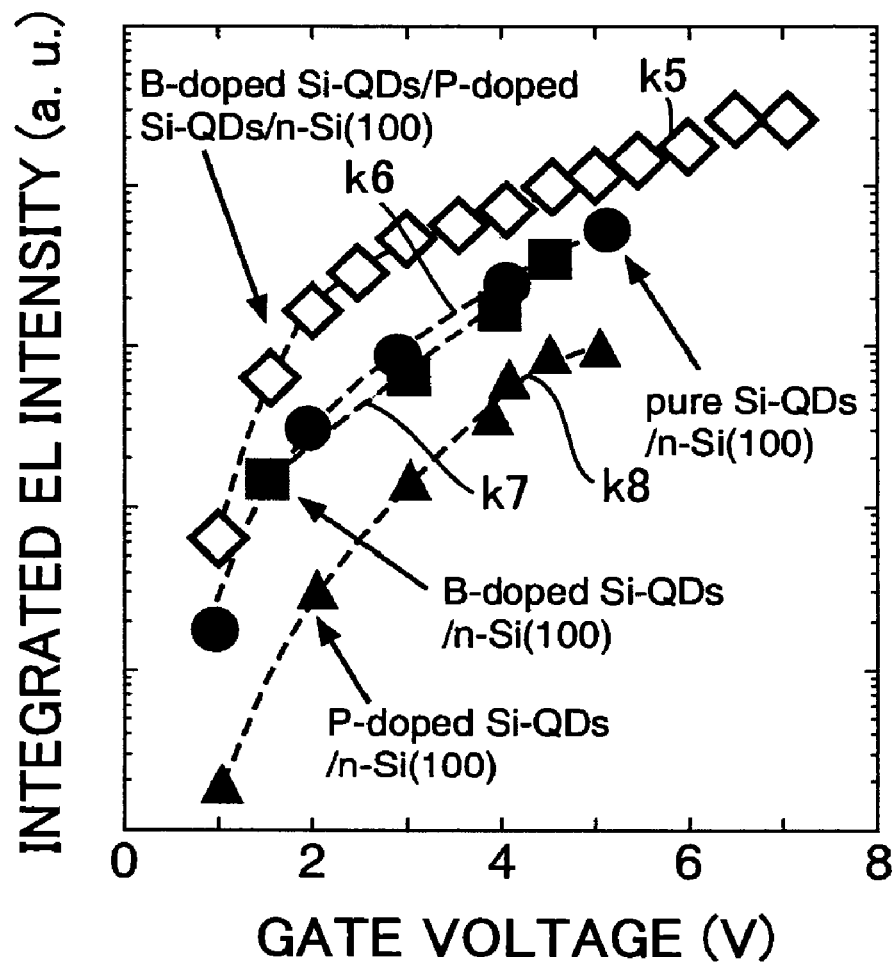
FIG. 14 illustrates the relationship between the integrated electro-luminescence (EL) intensity and the gate voltage of the light-emitting device shown in FIGS. 1 and 2.
Figure 15:
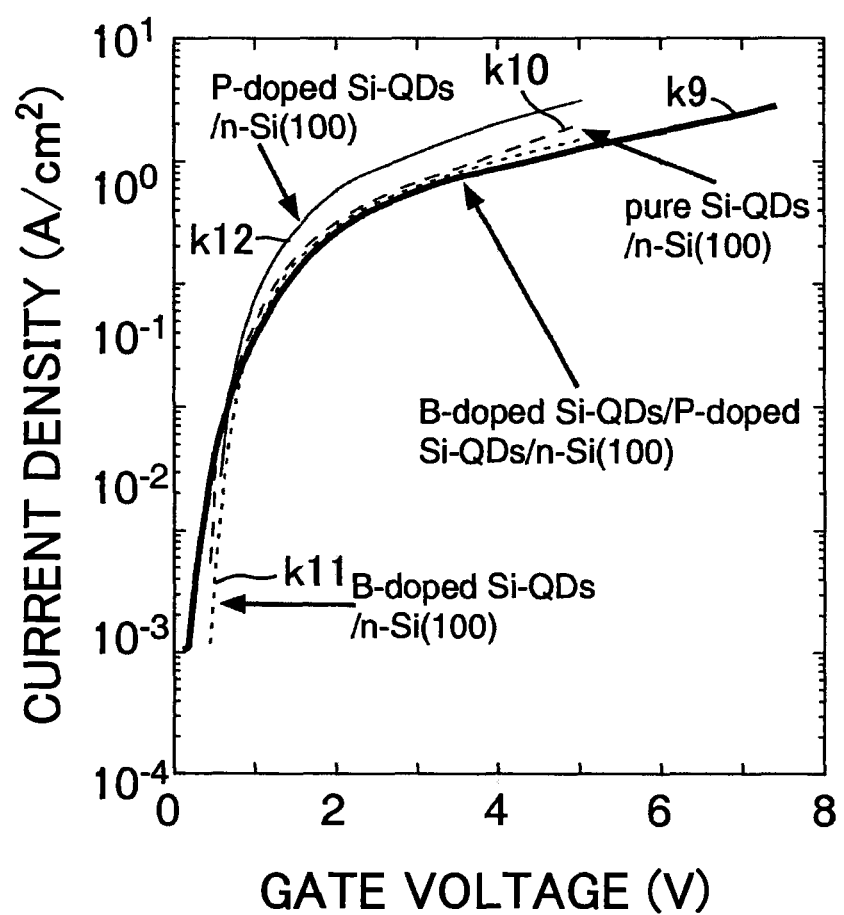
FIG. 15 is a graph illustrating the forward-biased current-voltage characteristics of the light-emitting device shown in FIGS. 1 and 2.

FIG. 14 illustrates the relationship between the integrated EL intensity and the gate voltage of the light-emitting device 10 shown in FIGS. 1 and 2. FIG. 15 illustrates the forward-biased current-voltage characteristics of the light-emitting device 10 shown in FIGS. 1 and 2.

In FIG. 14, the vertical axis represents the integrated EL intensity, while the abscissa axis represents the gate voltage. Curve k5 represents the relationship between the integrated EL intensity and the gate voltage of the light-emitting device 10, while curve k6 represents the relationship between the integrated EL intensity and the gate voltage of non-doped quantum dots formed on the substrate 1. Curve k7 represents the relationship between the integrated EL intensity and the gate voltage of B-doped quantum dots formed on the substrate 1, while curve k8 represents the relationship between the integrated EL intensity and the gate voltage of P-doped quantum dots formed on the substrate 1.

In FIG. 15, the vertical axis represents the current density, while the abscissa axis represents the gate voltage. Curve k9 represents the current-voltage characteristics of the light-emitting device 10, while curve k10 represents the current-voltage characteristics of a stack of non-doped quantum dots and the substrate 1. Curve k11 represents the current-voltage characteristics of a stack of B-doped quantum dots and the substrate 1, while curve k12 represents the current-voltage characteristics of a stack of P-doped quantum dots and the substrate 1.

When the gate voltage is lower than 0.7 V, the current density of the light-emitting device 10 is greater than that of the stack of non-doped quantum dots and the substrate 1, the stack of B-doped quantum dots and the substrate 1, and the stack of P-doped quantum dots and the substrate 1. When the gate voltage is 0.7 V or higher, the current density of the light-emitting device 10 is less than that of the stack of non-doped quantum dots and the substrate 1, the stack of B-doped quantum dots and the substrate 1, and the stack of P-doped quantum dots and the substrate 1 (see curves k9 to k12).

On the other hand, the emission intensity of the light-emitting device 10 is greater than that of the stack of non-doped quantum dots and the substrate 1, the stack of B-doped quantum dots and the substrate 1, and the stack of P-doped quantum dots and the substrate 1. More specifically, the emission intensity of the light-emitting device 10 is about ten times greater than that of the stack of non-doped quantum dots and the substrate 1, and the stack of B-doped quantum dots and the substrate 1, and is about hundred times greater than that of the stack of P-doped quantum dots and the substrate 1 (see curves k5 to k8).

As described above, by forming the dot members 3 and 4, which respectively comprise n-type silicon dots and p-type silicon dot, so that the dot members 3 and 4 are in contact with each other, the emission intensity of the light-emitting device 10 is ten times or more greater than the emission intensities of a sample comprising non-doped silicon dots and a sample comprising either of n-type silicon dots or p-type silicon dots.

Figure 16:
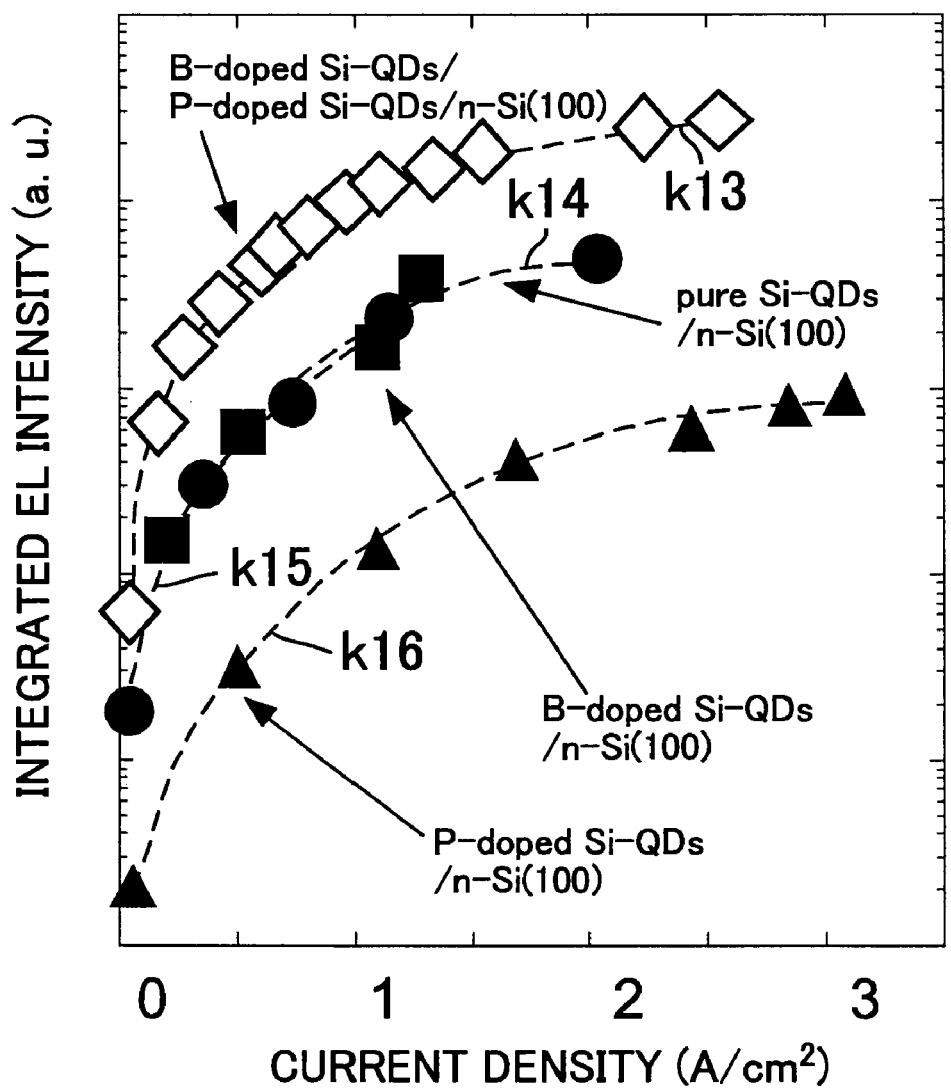
FIG. 16 is a graph illustrating the relationship between the integrated EL intensity and the current density of the light-emitting device shown in FIGS. 1 and 2.

FIG. 16 is a graph illustrating the relationship between the integrated EL intensity and the current density of the light-emitting device 10 shown in FIGS. 1 and 2. In FIG. 16, the vertical axis represents the integrated EL intensity, while the abscissa axis represents the current density. Curve k13 represents the relationship between the integrated EL intensity and the current density of the light-emitting device 10, while curve k14 represents the relationship between the integrated EL intensity and the current density of a stack of non-doped quantum dots, and the substrate 1. Curve k15 represents the relationship among the integrated EL intensity, the current density of a stack of B-doped quantum dots, and the substrate 1; while curve k16 represents the relationship among the integrated EL intensity, the current density of a stack of P-doped quantum dots, and the substrate 1.

The emission intensity of the light-emitting device 10 is greater than that of the stack of non-doped quantum dots and the substrate 1, the stack of B-doped quantum dots and the substrate 1, and the stack of P-doped quantum dots and the substrate 1. More specifically, in the same current density, the emission intensity of the light-emitting device 10 is approximately ten times greater than the emission intensities of the stack of non-doped quantum dots and the substrate 1, and the stack of B-doped quantum dots and the substrate 1, and is approximately 100 times greater than the emission intensity of the stack of P-doped quantum dots and the substrate 1 (see curves k13 to k16).

As described above, by forming the dot members 3 and 4, which respectively comprise n-type silicon dots and p-type silicon dots, so that the dot members 3 and 4 are in contact with each other, the resulting luminous efficiency ten times or more greater. This is because electrons injected into the quantum dots 311 and holes injected into the quantum dots 411 are highly likely to be confined in the sublevels $L_{sub}1$ and $L_{sub}4$, respectively, and recombine to emit light.

Figure 17:
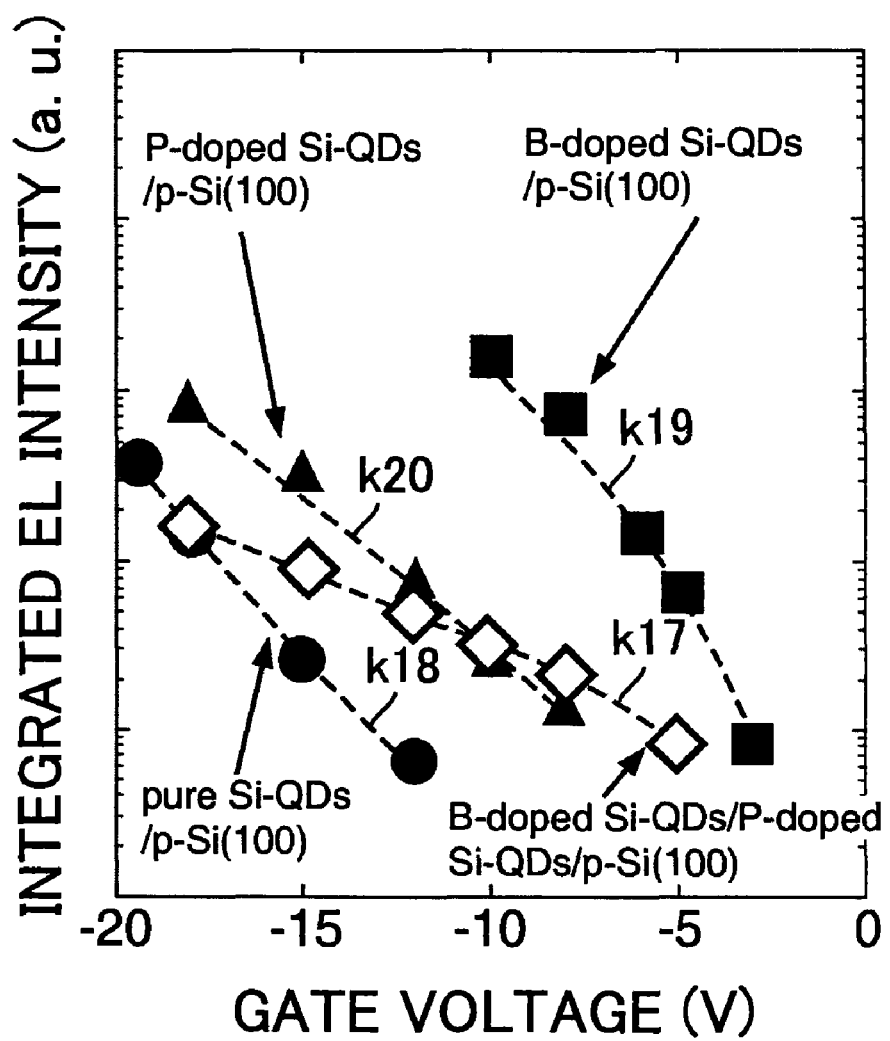
FIG. 17 is a graph illustrating the relationship between the integrated EL intensity and the gate voltage of the light-emitting device shown in FIGS. 10 and 11.
Figure 18:
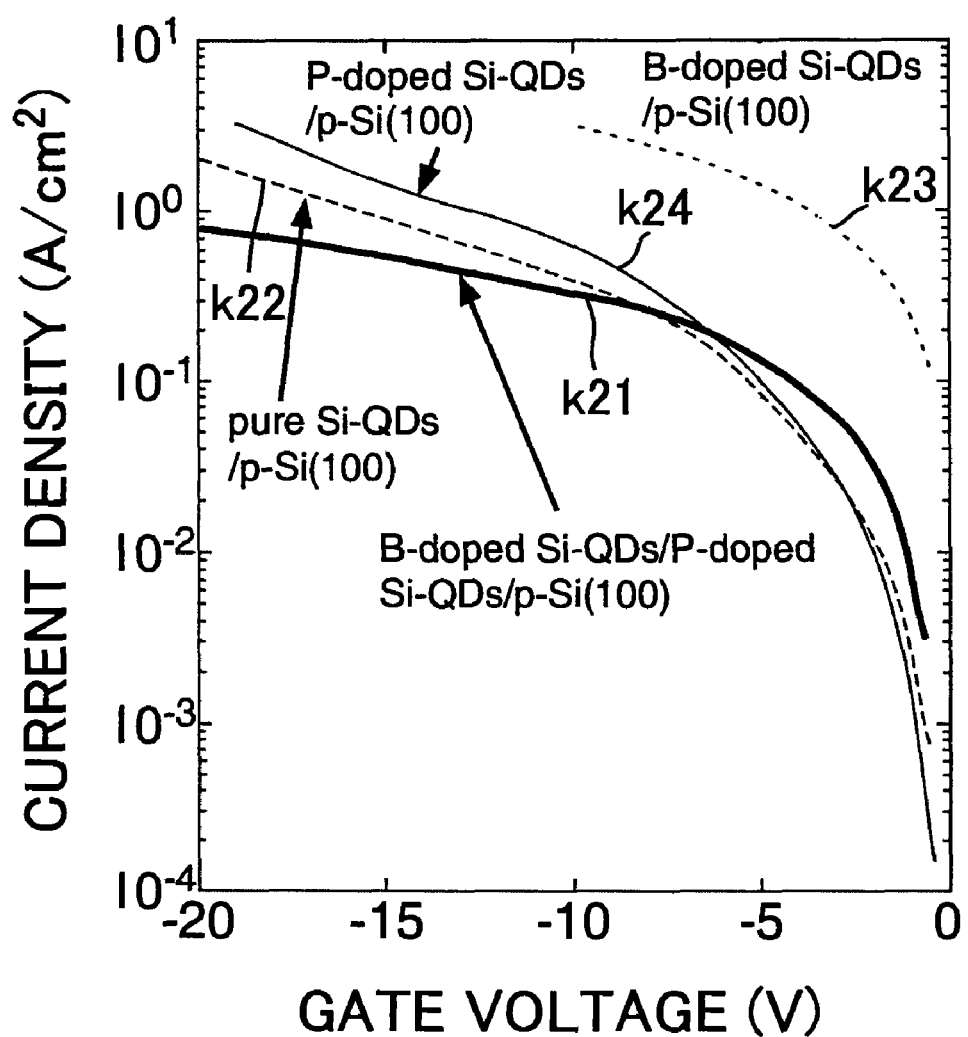
FIG. 18 is a graph illustrating the reverse-biased current-voltage characteristics of the light-emitting device shown in FIGS. 10 and 11.

FIG. 17 is a graph illustrating the relationship between the integrated EL intensity and the gate voltage of the light-emitting device 10A shown in FIGS. 10 and 11. FIG. 18 is a graph illustrating the current-voltage characteristics of the light-emitting device 10A shown in FIGS. 10 and 11, which are reverse-biased; i.e., biased in the reverse direction.

In FIG. 17, the vertical axis represents the integrated EL intensity, while the abscissa axis represents the gate voltage. Curve k17 represents the relationship between the integrated EL intensity and the gate voltage of the light-emitting device 10A, while curve k18 represents the relationship between the integrated EL intensity and the gate voltage of non-doped quantum dots formed on the substrate 1A. Curve k19 represents the relationship between the integrated EL intensity and the gate voltage of B-doped quantum dots formed on the substrate 1A, while curve k20 represents the relationship between the integrated EL intensity and the gate voltage of P-doped quantum dots formed on the substrate 1A.

In FIG. 18, the vertical axis represents the current density, while the abscissa axis represents the gate voltage. Curve k21 represents the current-voltage characteristics of the light-emitting device 10A, while curve k22 represents the current-voltage characteristics of a stack of non-doped quantum dots and the substrate 1A. Curve k23 represents the current-voltage characteristics of a stack of B-doped quantum dots and the substrate 1A, while curve k24 represents the current-voltage characteristics of a stack of P-doped quantum dots and the substrate 1A.

When the gate voltage is higher than about −7 V, the current density of the light-emitting device 10A is greater than that of the stack of non-doped quantum dots and the substrate 1A, and the stack of P-doped quantum dots and the substrate 1A, and is lower than that of the stack of B-doped quantum dots and the substrate 1A. When the gate voltage is approximately about −7 V or lower, the current density of the light-emitting device 10A is lower than the current densities of the stack of non-doped quantum dots and the substrate 1A, the stack of B-doped quantum dots and the substrate 1A, and the stack of P-doped quantum dots and the substrate 1A (see curves k21 to k24).

On the other hand, when the gate voltage is higher than about −10 V, the emission intensity of the light-emitting device 10A is greater than that of the stack of non-doped quantum dots and the substrate 1A, and the stack of P-doped quantum dots and the substrate 1A, and is less than that of the stack of B-doped quantum dots and the substrate 1A. When the gate voltage is about −10 V to −18 V, the emission intensity of the light-emitting device 10A is greater than that of the stack of non-doped quantum dots and the substrate 1A, and less than that of the stack of B-doped quantum dots and the substrate 1A, and the stack of P-doped quantum dots and the substrate 1A (see curve k17 to curve k20).

Figure 19:
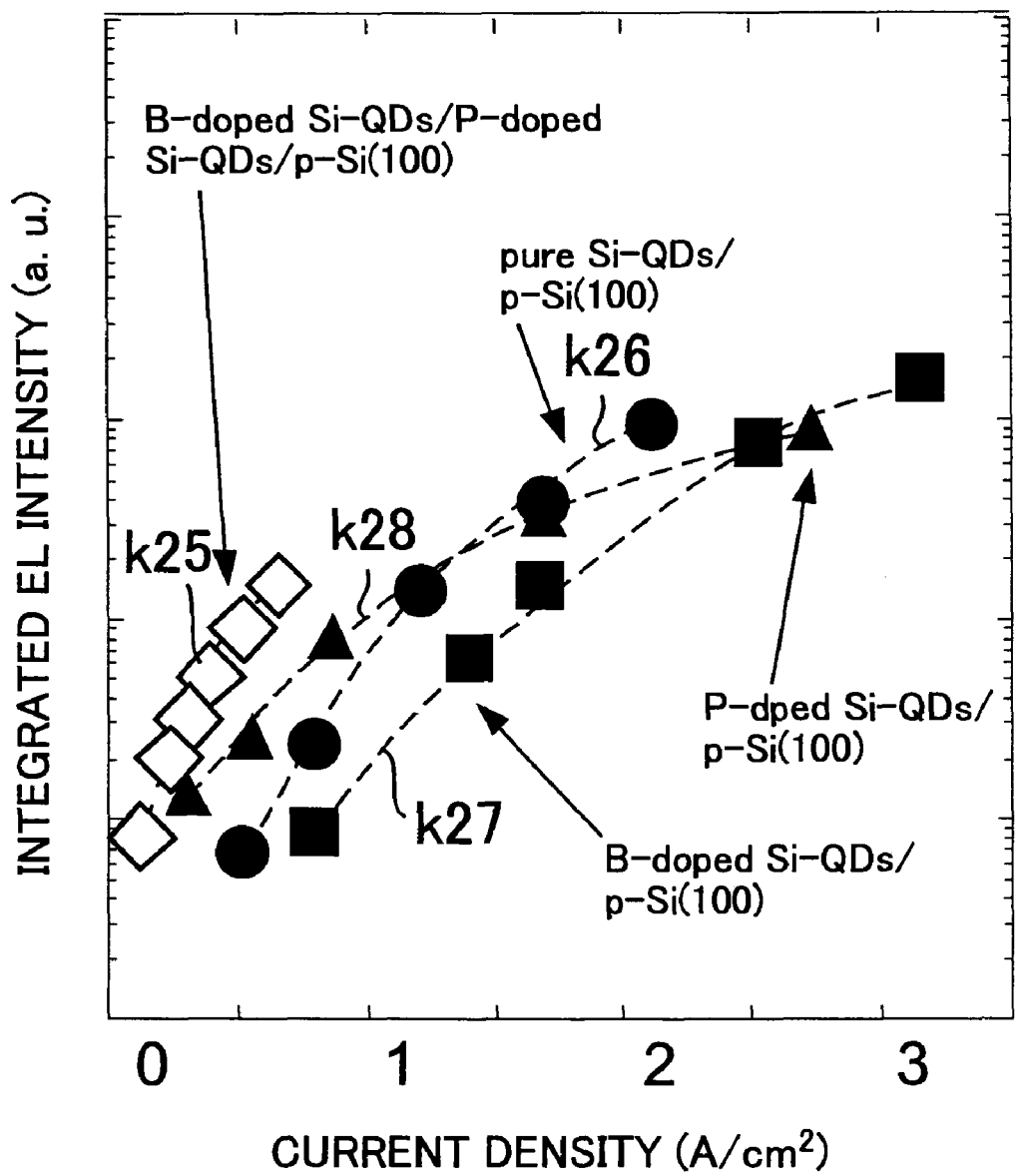
FIG. 19 is a graph illustrating the relationship between the integrated EL intensity and the current density of the light-emitting device shown in FIGS. 10 and 11.

FIG. 19 is a graph illustrating the relationship between the integrated EL intensity and the current density of the light-emitting device 10A shown in FIGS. 10 and 11. In FIG. 19, the vertical axis represents the integrated EL intensity, while the abscissa axis represents the current density. Curve k25 represents the relationship between the integrated EL intensity and the current density of the light-emitting device 10A, while curve k26 represents the relationship between the integrated EL intensity and the current density of a stack of non-doped quantum dots and the substrate 1A. Curve k27 represents the relationship between the integrated EL intensity and the current density of a stack of B-doped quantum dots and the substrate 1A, while curve k28 represents the relationship between the integrated EL intensity and the current density of a stack of P-doped quantum dots and the substrate 1A.

When the current density is lower than 1 A/cm², the emission intensity of the light-emitting device 10A is greater than that of the stack of non-doped quantum dots and the substrate 1A, the stack of B-doped quantum dots and the substrate 1A, and the stack of P-doped quantum dots and the substrate 1A.

Importantly, the emission intensity of the light-emitting device 10A is at least ten times or more greater than that of the stack of non-doped quantum dots and the substrate 1A, and the stack of B-doped quantum dots and the substrate 1A (see curves k25 to k28).

When the substrate 1A is fabricated of p-type silicon, the emission intensity of the light-emitting device 10A is, in the same gate voltage, less than that of a sample stack of B-doped quantum dots and the substrate 1A (see curves k17 and k19 of FIG. 17). However, in this case, using the same current density, the emission intensity is ten times, or more, greater than that of a sample stack of B-doped quantum dots and the substrate 1A (see curves k25 and k27 of FIG. 19).

Therefore, when the p-type substrate 1A is used, the resulting luminous efficiency still ten times or more greater when the dot members 3 and 4 are formed. These dot members 3 and 4 respectively comprise n-type silicon dots and p-type silicon dots, so that the dot members 3 and 4 make contact with each other.

As described above, if the dot members 3 and 4, which respectively comprise n-type silicon dots and p-type silicon dots, are formed so that the dot members 3 and 4 are in contact with each other, the emission intensity of the light-emitting devices 10 and 10A will be enhanced by means of either of the n-type substrate 1 or the p-type substrate 1A.

Figure 20:
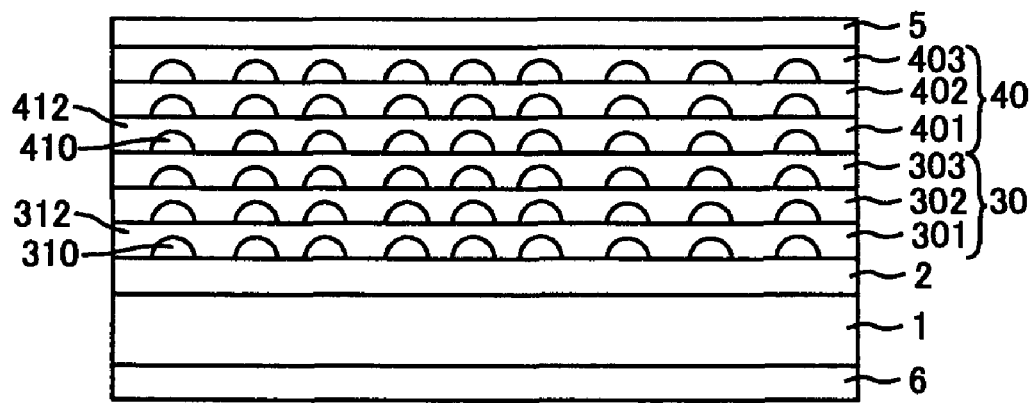
FIG. 20 is a cross-sectional view of another light-emitting device in accordance with an illustrative embodiment of the present invention.

FIG. 20 is a cross sectional view of another light-emitting device in accordance with an embodiment of the present invention. With reference to FIG. 20, a light-emitting device 10B in accordance with an embodiment of the present invention is identical to the light-emitting device 10 shown in FIGS. 1 and 2, except that the dot members 3 and 4 of the light-emitting device 10 are, respectively, replaced with dot members 30 and 40.

The dot member 30 is formed on the silicon dioxide film 2 so that it makes contact with the silicon dioxide film 2. The dot member 40 is formed on the dot member 30 so that it makes contact with the dot member 30. The electrode 5 is formed on the dot member 40 so that it makes contact with the dot member 40.

The dot member 30 comprises quantum dot layers 301 through 303. The quantum dot layer 301 is identical to the quantum dot layer 31, except that the quantum dot 311 of the quantum dot layer 31 is replaced with a quantum dot 310.

The quantum dot 310 comprises a p-doped Ni silicide dot. The quantum dot 310 has a diameter of some 10 nm or less and a height of some 5 nm. The P-concentration in the quantum dot 310 is $10^{17}$ to $10^{18}$ cm$^{-3}$.

It should be noted that each of the quantum dot layers 302 and 303 has the same structure as the quantum dot layer 301.

The dot member 40 comprises quantum dot layers 401 to 403. The quantum dot layer 401 is identical to the quantum dot layer 41, except that the quantum dot 411 of the quantum dot layer 41 is replaced with a quantum dot 410.

The quantum dot 410 comprises a B-doped nickel (Ni) silicide dot. The quantum dot 410 has a diameter of some 10 nm or less and a height of some 5 nm. The B-concentration in the quantum dot 410 is $10^{17}$ to $10^{18}$ cm$^{-3}$.

It should be noted that each of the quantum dot layers 402 and 403 has the same structure as the quantum dot layer 401.

The quantum dot layers 301 to 303 are sequentially laminated on the silicon dioxide film 2, while the quantum dot layers 401 to 403 are sequentially laminated on the dot member 30.

Figure 21:
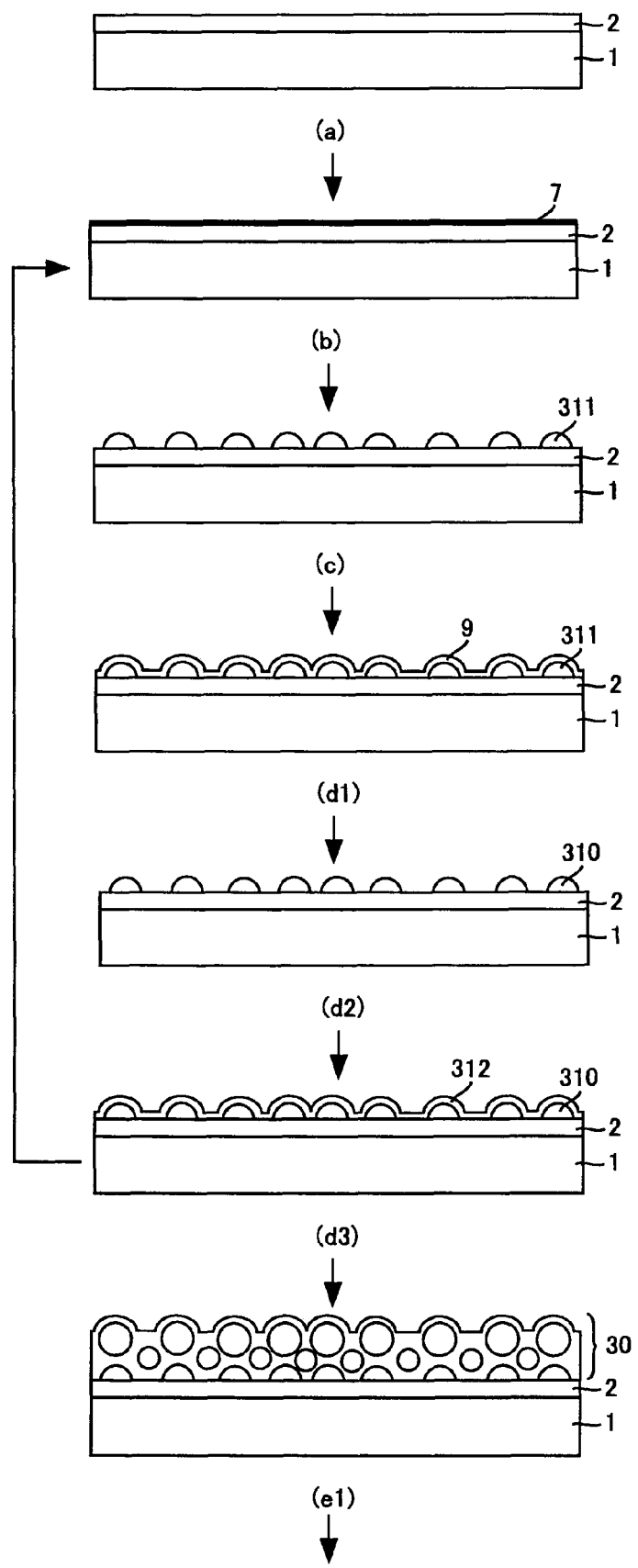
FIG. 21 is a first flowchart illustrating how the light-emitting device shown in FIG. 20 is fabricated.
Figure 22:
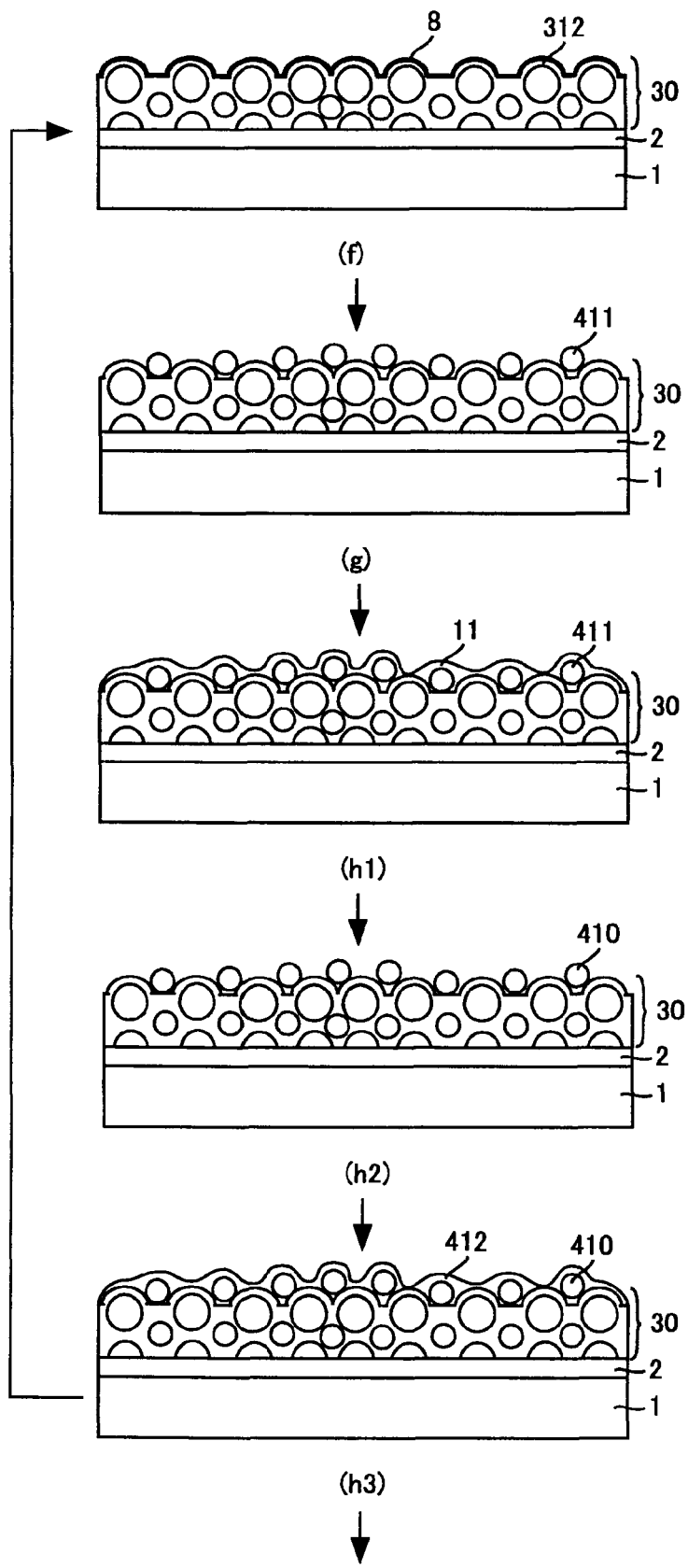
FIG. 22 is a second flowchart illustrating how the light-emitting device shown in FIG. 20 is fabricated.
Figure 23:
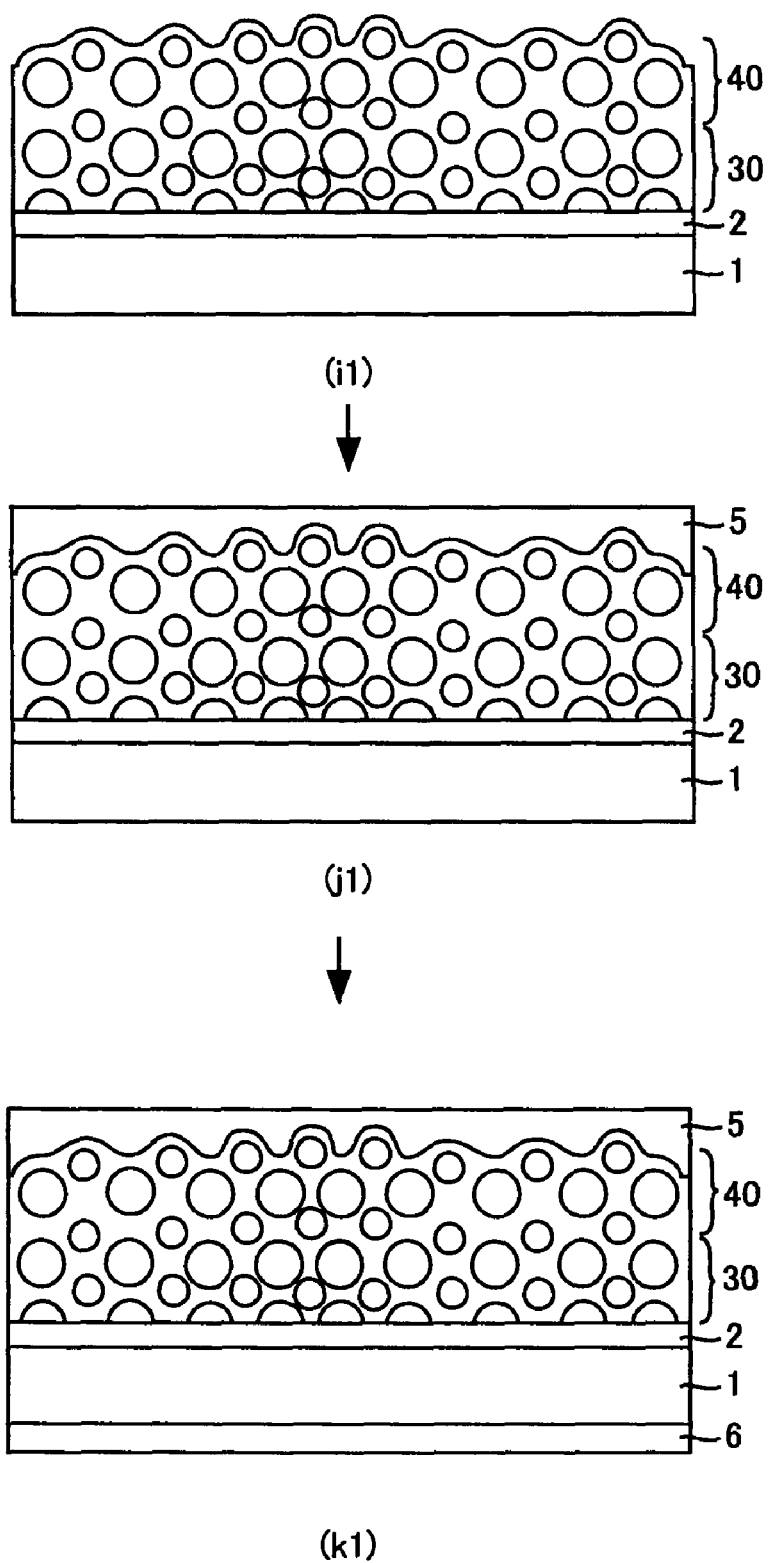
FIG. 23 is a third flowchart illustrating how the light-emitting device shown in FIG. 20 is fabricated.

FIGS. 21 to 23 are flowcharts illustrating, sequentially, how the light-emitting device 10B shown in FIG. 20 is fabricated.

With reference to FIG. 21, upon beginning the fabrication of the light-emitting device 10B, after the above-described steps (a) to (c) are sequentially executed, an Ni thin film 9 is formed on the quantum dots 311 (see step (d1)), and the quantum dots 311 and the Ni thin film 9 are then thermally treated to form the quantum dots 310 (see step (d2)).

Using the methods above described, the silicon dioxide film 312 is then formed on the quantum dots 310 (see step (d3)). Steps (b) to (d3) are then repeated twice to form the dot member 30 on the silicon dioxide film 2 (see step (e1)).

After the above-described steps (f) and (g) are sequentially executed, a Ni thin film 11 is formed on the quantum dots 410 (see step (h1)), and the quantum dots 410 and the Ni thin film 11 are then thermally treated to form the quantum dots 410 (see step (h2)).

Using the methods described above, the silicon dioxide film 412 is subsequently formed on the quantum dots 410 (see step (h3)).

Steps (f) to (h3) are then repeated twice to form the dot member 40 on the dot member 30 (see step (i1)).

The electrode 5 is then formed on the dot member 40 by evaporation (see step (j1)), while the electrode 6 is formed on the rear surface of the substrate 1 by evaporation (see step (k1)), completing the fabrication of the light-emitting device 10B.

As described above, the light-emitting device 10B comprises the quantum dots 310, which are formed of P-doped Ni silicide dots, and the quantum dots 410, which are formed of B-doped Ni silicide dots, and therefore, have luminous efficiency slightly less than or equal to the luminous efficiency of the light-emitting devices 10 and 10A.

It should be noted that in the light-emitting device 10B, the dot member 40 may be formed on the silicon dioxide film 2 so that they are in contact with each other, and the dot member 30 may be formed on the dot member 40 so that they are in contact with each other.

Further, in the light-emitting device 10B, the quantum dots 310 and 410 may be formed of tungsten (W) silicide.

Further, as described above, dot member 3 of the light-emitting device 10 comprises the three-fold stack of quantum dot layers 31 to 33, and the dot member 4 comprises the three-fold stack of quantum dots 41 to 43. However, representative embodiments are not limited to these aspects. Rather, the dot member 3 of the light-emitting device 10 need only comprise two or more quantum dot layers comprising P-doped quantum dots, and the dot member 4 need only comprise two or more quantum dot layers comprising B-doped quantum dots. In addition, the light-emitting devices 10A and 10B exhibit similar qualities.

The dot member 3 constitutes the first dot member, while the dot member 4 constitutes the second dot member. The dot member 30 constitutes the first dot member, while the dot member 40 constitutes the second dot member. The quantum dot 311 constitute the first quantum dot, while the silicon dioxide film 312 constitutes the first insulating layer. Further, the quantum dot 411 constitutes the second quantum dot, while the silicon dioxide film 412 constitutes the second insulating layer.

The embodiments as have been described here are examples and should not be interpreted as restrictive. The scope of the present invention is determined by each of the claims, not by the written description of the embodiments, and embraces modifications within the meaning of, and equivalent to, the languages in the claims.

The present disclosure is not to be limited in terms of the particular embodiments described in this application. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," "greater than," "less than," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A luminous element comprising:
   a first dot member including first quantum dots of a first conductivity type; and
   a second dot member disposed in contact with the first dot member and including second quantum dots of a second conductivity type different from the first conductivity type; wherein
   the first dot member includes
      the first quantum dots and
      a first insulating layer covering the first quantum dots;
   the second dot member includes
      the second quantum dots and
      a second insulating layer covering the second quantum dots; and
   the first and second quantum dots include metal silicide dots.

2. The luminous element according to claim 1 further comprising a substrate being in contact with the first dot member and having the first conductivity type, wherein the second dot member is disposed on the first dot member.

3. The luminous element according to claim 2, wherein the first conductivity type is p-type and the second conductivity type is n-type.

4. The luminous element according to claim 2, wherein the first conductivity type is n-type and the second conductivity type is p-type.

5. A method of manufacturing a luminous element comprising:
   a first step of depositing a first dot member including first quantum dots of a first conductivity type on a main surface of a semiconductor substrate of the first conductivity type; and
   a second step of depositing a second dot member including second quantum dots of a second conductivity type on the first dot member, the second conductivity type being different from the first conductivity type; wherein
   the first step includes
      a first sub-step of supplying, to a reaction chamber, a first material gas to deposit intrinsic third quantum dots and
      a second sub-step of supplying, to the reaction chamber, a first impurity gas in addition to the first material gas;
   the second step includes
      a third sub-step of supplying, to the reaction chamber, a second material gas to deposit intrinsic fourth quantum dots and
      a fourth sub-step of supplying, to the reaction chamber, a second impurity gas in addition to the second material gas;
   the first dot member includes
      the first quantum dots and
      a first insulating layer covering the first quantum dots; and
   the second dot member includes
      the second quantum dots and
      a second insulating layer covering the second quantum dots.

6. The method of manufacturing a luminous element according to claim 5, wherein
   in the first sub-step, the first material gas is supplied to the reaction chamber from a first timing to a second timing;
   in the second sub-step, the first impurity gas is supplied, in addition to the first material gas, to the reaction chamber from a third timing to the second timing, the third timing being between the first timing and the second timing;
   in the third sub-step, the second material gas is supplied, in addition to the second material gas, to the reaction chamber from a fourth timing to a fifth timing; and
   in the fourth sub-step, the second impurity gas is supplied to the reaction chamber from a sixth timing to the fourth timing, the sixth timing being between the fourth timing and the fifth timing.

7. The method of manufacturing a luminous element according to claim 6, wherein
   the third timing is after the midpoint between the first timing and the second timing; and
   the sixth timing is after the midpoint between the fourth timing and the fifth timing.

8. The method of manufacturing a luminous element according to claim 7, wherein the first material gas is the same as the second material gas.

9. The method of manufacturing a luminous element according to claim 8, wherein
   in the first sub-step, a silane gas is supplied to the reaction chamber;

in the second sub-step, a phosphine gas is supplied to the reaction chamber in addition to the silane gas;

in the third sub-step, a silane gas is supplied to the reaction chamber; and in the fourth sub-step, a diborane gas is supplied to the reaction chamber in addition to the silane gas.

10. The method of manufacturing a luminous element according to claim 8, wherein in the first sub-step, a silane gas is supplied to the reaction chamber;

in the second sub-step, a diborane gas is supplied to the reaction chamber in addition to the silane gas;

in the third sub-step, a silane gas is supplied to the reaction chamber; and in the fourth sub-step, a phosphine gas is supplied to the reaction chamber in addition to the silane gas.

11. The method of manufacturing a luminous element according to claim 7, wherein the time length from the first timing to the second timing is substantially equal to that from the fourth timing to the fifth timing.

\* \* \* \* \*

UNITED STATES PATENT AND TRADEMARK OFFICE
CERTIFICATE OF CORRECTION

| | | |
|---|---|---|
| PATENT NO. | : 7,768,032 B2 | Page 1 of 1 |
| APPLICATION NO. | : 12/212406 | |
| DATED | : August 3, 2010 | |
| INVENTOR(S) | : Makihara et al. | |

It is certified that error appears in the above-identified patent and that said Letters Patent is hereby corrected as shown below:

In Fig. 19, Sheet 15 of 19, delete "P-dped" and insert -- P-doped --, therefor.

In Column 2, Line 4, delete "dot" and insert -- dot. --, therefor.

Signed and Sealed this
Twenty-second Day of May, 2012

David J. Kappos
*Director of the United States Patent and Trademark Office*